United States Patent
Wong et al.

(10) Patent No.: US 7,656,015 B2
(45) Date of Patent: Feb. 2, 2010

(54) PACKAGING SUBSTRATE HAVING HEAT-DISSIPATING STRUCTURE

(75) Inventors: Lin-Yin Wong, Hsin-Chu (TW); Mao-Hua Yeh, Hsin-Chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 12/283,538

(22) Filed: Sep. 12, 2008

(65) Prior Publication Data

US 2009/0072384 A1  Mar. 19, 2009

(30) Foreign Application Priority Data

Sep. 14, 2007  (TW) .............. 961314386 A

(51) Int. Cl.
*H01L 23/02* (2006.01)
(52) U.S. Cl. ............... 257/685; 257/723; 257/786; 257/E25.006
(58) Field of Classification Search ........... 257/685, 257/686, 723, 777, 706, 712–713, 730, 731, 257/782, 786, 758, 774, 680, E25.006, E25.013, 257/E25.018, E25.021, E25.027, E21.614, 257/E23.085
See application file for complete search history.

(56) References Cited

U.S. PATENT DOCUMENTS

2006/0115931 A1 * 6/2006 Hsu .......................... 438/121
2008/0169120 A1 * 7/2008 Inagaki et al. .............. 174/255

* cited by examiner

*Primary Examiner*—Davienne Monbleau
*Assistant Examiner*—Dilinh P Nguyen
(74) *Attorney, Agent, or Firm*—Peter F. Corless; Steven M. Jensen; Edwards Angell Palmer & Dodge LLP

(57) ABSTRACT

Provided is a packaging substrate with a heat-dissipating structure, including a core layer with a first surface and an opposite second surface having a first metal layer and a second metal layer respectively. Portions of the first metal layer are exposed from a second cavity penetrating the core layer and second metal layer. Portions of the second metal layer are exposed from a first cavity penetrating the core layer and first metal layer. Semiconductor chips each having an active surface with electrode pads thereon and an opposite inactive surface are received in the first and second cavities and attached to the second metal layer and the first metal layer respectively. Conductive vias disposed in build-up circuit structures electrically connect to the electrode pads of the semiconductor chips. A heat-dissipating through hole penetrating the core layer and build-up circuit structures connects the metal layers and contact pads.

16 Claims, 7 Drawing Sheets

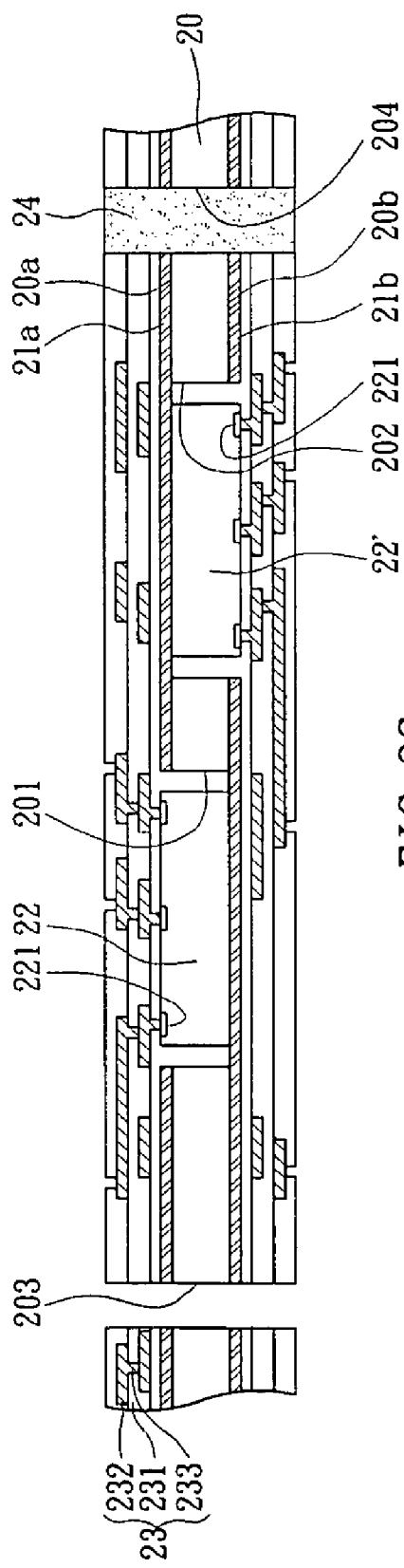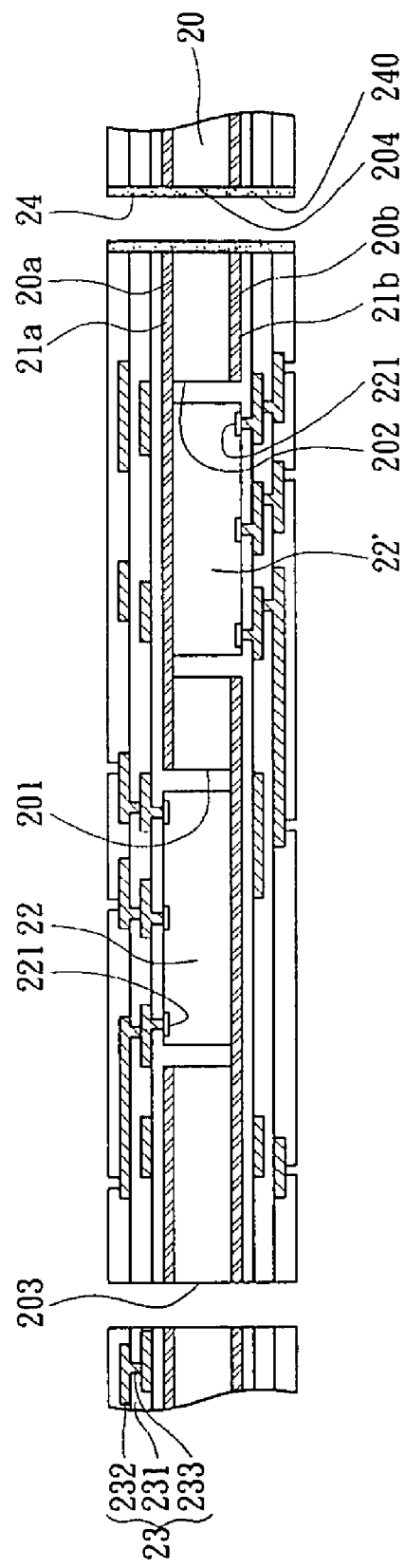

PACKAGING SUBSTRATE HAVING HEAT-DISSIPATING STRUCTURE

BACKGROUND OF THE INVENTION

1. Field of the Invention

The present invention relates to packaging substrate structures, and more particularly, to a packaging substrate having a heat-dissipating structure.

2. Description of the Prior Art

Owing to development of semiconductor packaging technology, semiconductor packages nowadays come in a variety of forms. Known methods for packaging semiconductor devices involve mounting an integrated circuit-laden semiconductor chip on a packaging substrate or a lead frame, electrically connecting the semiconductor chip to the packaging substrate or the lead frame, and encapsulating the packaging substrate with encapsulant. Ball Grid Array (BGA), which represents an advanced semiconductor packaging technology, is characterized by mounting a semiconductor chip on a packaging substrate and implanting a plurality of solder balls aligned in an array on the back of the packaging substrate, thereby increasing I/O connections provided on a carrier for the semiconductor chip per unit area so as to meet the demand for high-integration semiconductor chips. Ball Grid Array features solder balls whereby a BGA package unit is capable of being electrically connected to an external device via the solder balls.

Known semiconductor package structures are packaged in the following ways. Semiconductor chips are attached by inactive surfaces thereof, one by one, to the top surface of a substrate by wire bonding. The alternative, flip-chip packaging, is to implant solder bumps on the electrode pads of active surfaces of the semiconductor chips so as to allow the semiconductor chips to be mounted by the active surfaces on the substrate, and then implant solder balls on the back of the substrate so as to allow the semiconductor chips to be electrically connected to an external device. The prior art achieves a high pin number and yet is flawed by a resultant intricate layout on an unfavorably thick package structure due to limitation of semiconductor chips in surface area and size. Hence, the prior art is hardly conducive to miniaturization and improvement in performance as far as semiconductor chip package structures are concerned.

Given the boom of the electronic industry, the trend of the development of electronic products is toward versatility and high performance. To meet the demand for integration and miniaturization of semiconductor packages, manufacturers have to embed a semiconductor chip in a packaging substrate at the cost of the following drawback. An increasingly great amount of heat is generated by semiconductor chips in operation; procrastinated or inefficient dissipation of heat generated by the semiconductor chips in operation result in deteriorated performance and shortened service life of the semiconductor chips.

FIG. 1 is a cross-sectional view of a conventional package structure for a semiconductor chip embedded in a substrate. As shown in the drawing, a package structure comprises: a heat-dissipating board 12 formed with a cavity 120 therein; a semiconductor chip 13 with an active surface 13a having a plurality of electrode pads 131 formed thereon and an opposite inactive surface 13b, wherein the semiconductor chip 13 is received in the cavity 120 by the inactive surface 13b; a dielectric layer 14 formed on the heat-dissipating board 12 and the active surface 13a of the semiconductor chip 13; and a wiring layer 15 formed on the dielectric layer 14 and electrically connected to electrode pads 131 of the semiconductor chip 13 by conductive vias 151 formed in the dielectric layer 14.

Although the aforesaid drawback of the prior art can be overcome with a solution, namely using a package structure which comprises a semiconductor chip-embedded substrate, the solution brings more problems. Given a significant difference between the heat-dissipating board 12 and the dielectric layer 14 in coefficient of thermal expansion (CTE), variable thermal stress exhibited by individual components, together with unilateral build-up, is likely to cause warpage to the package structure. Uncontrolled warpage may delaminate a package structure or crack a long-compressed semiconductor chip. In this regard, a way to prevent warpage is to thicken a heat-dissipating board so as to counter the thermal stress developed in a substrate due to variation of temperature. However, a thick heat-dissipating board accompanies a thick bulky package structure and incurs process costs.

Accordingly, an issue that prevails in the electronic industry and calls for immediate solution involves providing a packaging substrate structure for elimination of the drawbacks of the prior art, namely warpage, increased thickness and weight, and high costs.

SUMMARY OF THE INVENTION

In view of the aforesaid drawbacks of the prior art, it is the primary objective of the present invention to provide a packaging substrate having a heat-dissipating structure so as to efficiently dissipate heat generated by a semiconductor chip in operation.

Another objective of the present invention is to provide a packaging substrate having a heat-dissipating structure so as to evade increasing thickness and weight of package structures and incurring costs.

Yet another objective of the present invention is to provide a packaging substrate having a heat-dissipating structure so as to evade increasing the size of the packaging substrate but enhance the electrical performance of the packaging substrate.

A further objective of the present invention is to provide a packaging substrate having a heat-dissipating structure so as to protect the packaging substrate against warpage by forming a wiring layer on both sides of the packaging substrate.

To achieve the above and other objectives, the present invention discloses a packaging substrate having a heat-dissipating structure, comprising: a core layer with a first surface having a first metal layer and an opposite second surface having a second metal layer, and with at least a first cavity penetrating the core layer and the first metal layer so as to expose the second metal layer from the first cavity, also at least a second cavity penetrating the core layer and the second metal layer so as to expose the first metal layer from the second cavity; a plurality of semiconductor chips each having an active surface with a plurality of electrode pads thereon and an opposite inactive surface, wherein the semiconductor chips are received in the first cavity and the second cavity, and attached to the second metal layer and the first metal layer, respectively, by the inactive surfaces; build-up circuit structures respectively disposed on the first metal layer and the second metal layer as well as the semiconductor chips, and having a plurality of conductive vias electrically connecting to the electrode pads of the semiconductor chips; and at least a heat-dissipating through hole penetrating the core layer and the build-up circuit structures, and connecting the first metal layer and the second metal layer.

The build-up circuit structures each comprise at least a dielectric layer, a wiring layer disposed on the dielectric layer, and a conductive vias disposed in the dielectric layer electrically connecting the semiconductor chips and the wiring layers. The outmost wiring layers of the build-up circuit structures have a plurality of conductive pads. At least a plated through hole penetrates the core layer and the build-up circuit structures, electrically connecting the wiring layers of the build-up circuit structures. An insulation material is disposed surrounding the plated through hole so that the plated through hole is insulated from the core layer, the first metal layer, the second metal layer, and the build-up circuit structures. A contact pad or an outward extending contact pad connecting to the heat-dissipating through hole is disposed on a surface of the outmost dielectric layer of the build-up circuit structure. An insulating protective layer is disposed on the surfaces of the build-up circuit structures. A plurality of openings are disposed in the insulating protective layer, thereby exposing the conductive pads of the build-up circuit structures and the contact pad on the heat-dissipating through hole. A heat-conduction component in the form of a metal ball or a metal pin is disposed on the contact pad. Heat generated by the semiconductor chips in operation is dissipated by means of the first metal layer and the second metal layer, the heat-dissipating through hole, and the heat-conduction component.

Optionally, an adhesive fills the gap between the semiconductor chip and the first cavity, thereby fixing the semiconductor chip in the first cavity. Also, the adhesive fills the gap between the semiconductor chip and the second cavity, thereby fixing the semiconductor chip in the second cavity. Alternatively, the dielectric layer fills the gap between the semiconductor chip and the first cavity, thereby fixing the semiconductor chip in the first cavity, also the dielectric layer fills the gap between the semiconductor chip and the second cavity, thereby fixing the semiconductor chip in the second cavity.

A packaging substrate having a heat-dissipating structure of the present invention further comprises an electrical-conduction component, such as a solder ball, disposed on the conductive pads. The electrical-conduction component provides electrical connection with another electronic device.

In another embodiment of the present invention, the build-up circuit structures each comprise at least a dielectric layer, a wiring layer disposed on the dielectric layer, and a conductive via disposed in the dielectric layer. The outmost wiring layers of the build-up circuit structures have a plurality of conductive terminals (golden fingers) functioning as conductive pads. At least a plated through hole penetrates the core layer and the build-up circuit structures and electrically connects the outmost wiring layers of the build-up circuit structures. An insulation material is disposed surrounding the plated through hole so that the plated through hole is insulated from the core layer; the first metal layer, the second metal layer, and the build-up circuit structures. A contact pad or an outward extending contact pad connecting to the heat-dissipating through hole is disposed on a surface of the outmost dielectric layer of the build-up circuit structure. An insulating protective layer is disposed on the surface of the build-up circuit structures. A plurality of openings are disposed in the insulating protective layer, thereby exposing the conductive terminals and the contact pad. A heat-conduction component, such as a heat sink, is disposed on the contact pad.

The present invention provides a packaging substrate having a heat-dissipating structure. The packaging substrate comprises a plurality of semiconductor chips mounted on the first metal layer and the second metal layer exposed from the first cavity and the second cavity in a core layer. Heat generated by the semiconductor chips in operation is taken by the first metal layer and the second metal layer and then transferred to a heat-conduction component via a heat-dissipating through hole, so as to enhance heat dissipation. The first metal layer and the second metal layer disposed on the core layer and the heat-dissipating through hole penetrating the core layer and the build-up circuit structures not only enhance heat dissipation but also eliminate the drawbacks of the prior art, namely a plethora of components, excessive thickness, overweight, and high costs. The packaging substrate of the present invention features enhanced electrical performance and minimal thickness, and is free of warpage by forming a wiring layer on both sides of the packaging substrate.

BRIEF DESCRIPTION OF THE DRAWINGS

FIGS. 2A to 2F are schematic views showing a first embodiment of a method for fabricating a packaging substrate having a heat-dissipating structure according to the present invention;

FIG. 2B' is a schematic view of an alternative structure for implementing the packaging substrate shown in FIG. 2B;

FIG. 2E' is a schematic view of an alternative structure for implementing the packaging substrate shown in FIG. 2E.

DETAILED DESCRIPTION OF THE EMBODIMENTS

The present invention is herein illustrated with specific embodiments, so that one skilled in the pertinent art can easily understand other advantages and effects of the present invention from the disclosure of the invention.

First Embodiment

FIGS. 2A to 2F are cross-sectional views showing a first embodiment of a method for fabricating a packaging substrate having a heat-dissipating structure according to the present invention.

Figure 1:
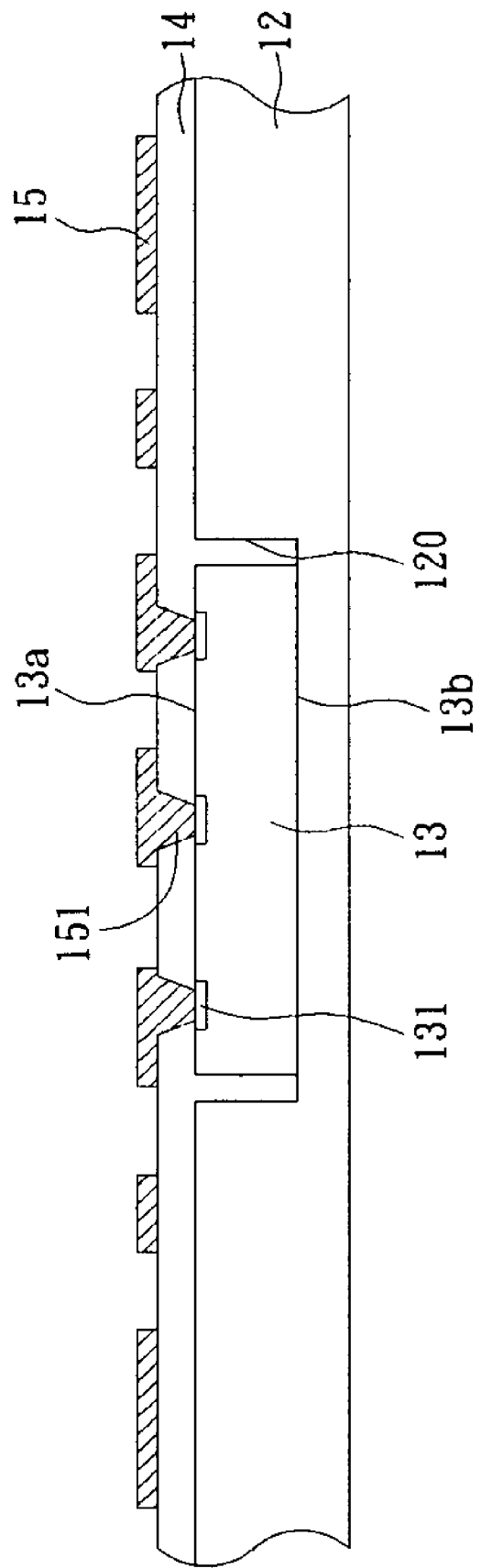
FIG. 1 (PRIOR ART) is a schematic view of a conventional package structure for a semiconductor chip.
Figure 2A:
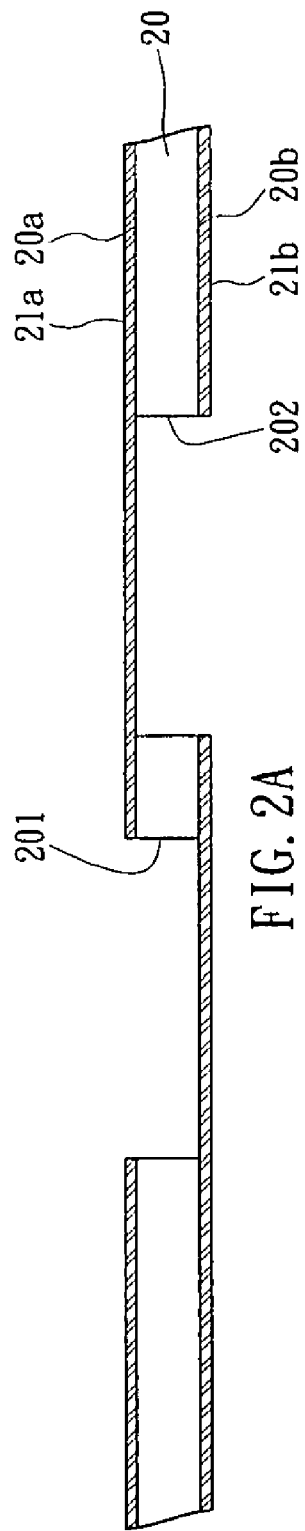

Referring to FIG. 2A, a core layer 20 such as a copper cladded laminate (CCL) is provided. The copper cladded laminate essentially comprise a composite board composed of an insulating layer sandwiched in between two copper foils. The core layer 20 has a first surface 20*a* and an opposite second surface 20*b*. The first surface 20*a* has a first metal layer 21*a*. The second surface 20*b* has a second metal layer 21*b*. A first cavity 201 is formed to penetrate the core layer 20 and the first metal layer 21*a*, thereby exposing the second metal layer 21*b*. A second cavity 202 is formed to penetrate the core layer 20 and the second metal layer 21*b*, thereby exposing the first metal layer 21*a*.

Figure 2B:
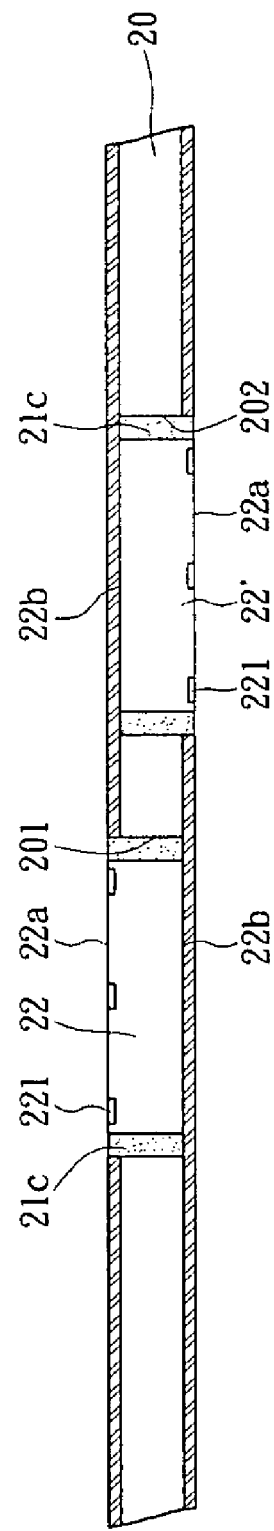
Figure 2B:
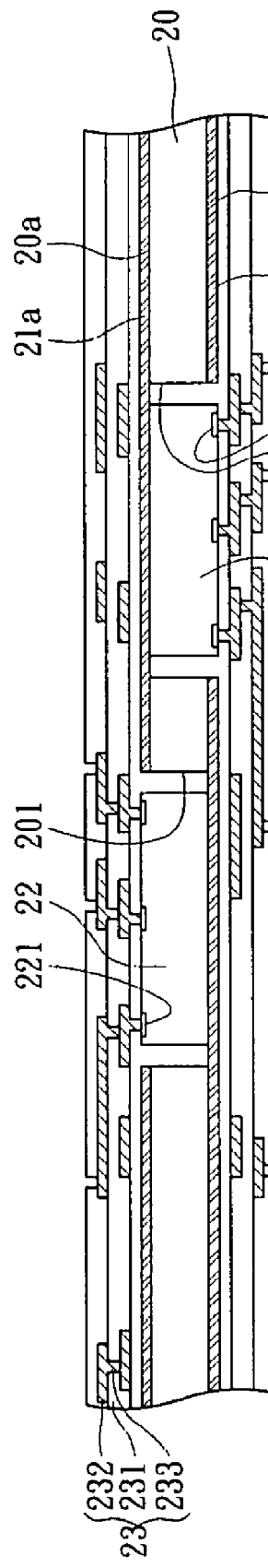

Referring to FIGS. 2B and 2B', semiconductor chips 22, 22' are received in the first cavity 201 and the second cavity 202, respectively. Each of the semiconductor chips 22, 22' has an active surface 22*a* and an opposite inactive surface 22*b*. The semiconductor chips 22, 22' are received in the first cavity 201 and the second cavity 202 and attached to the second metal layer 21*b* and the first metal layers 21*a*, respectively, by the inactive surfaces 22*b*. A plurality of electrode pads 221 are formed on the active surface 22*a*. The gap between the semiconductor chip 22 and the first cavity 201 and the gap between the semiconductor chip 22' and the second cavity 202 are filled with an adhesive 21c, such that the semiconductor chips 22, 22' are fixed in the first cavity 201 and the second cavity 202 respectively, as shown in FIG. 2B. Alternative, referring to FIG. 2B', at least a build-up circuit structure 23 is formed on the first metal layer 21a and the second metal layer 21b as well as the semiconductor chips 22, 22'. The build-up circuit structure 23 comprises at least a dielectric layer 231, a wiring layer 232 disposed on the dielectric layer 231, and a plurality of conductive vias 233 formed in the dielectric layer 231. The gap between the semiconductor chip 22 and the first cavity 201 and the gap between the semiconductor chip 22' and the second cavity 202 are filled with the dielectric layer 231 respectively, thereby fixing the semiconductor chips 22, 22' correspondingly in the first cavity 201 and the second cavity 202. The conductive vias 233 of the build-up circuit structure 23 electrically connect to electrode pads 221 of the semiconductor chips 22, 22'. The description below is based on the embodiment of fixing the semiconductor chips 22, 22' in position by the dielectric layer 231. The ways of fixing semiconductor chips in position as described earlier are not limited to filling the opening/chip gaps with a dielectric layer or an adhesive. In practice, it is feasible to fill the gap between the semiconductor chip 22 and the first cavity 201 with a dielectric layer and fill the gap between the semiconductor chip 22' and the second cavity 202 with an adhesive, and vice versa (not shown).

Referring to FIG. 2C, at least a first through hole 203 and at least a second through hole 204 are formed in the build-up circuit structure 23 and the core layer 20. The first metal layer 21a and the second metal layer 21b are exposed from the first through hole 203. The second through hole 204 is filled with an insulation material 24.

Referring to FIG. 2D, a third through hole 240 is formed in the insulation material 24 which otherwise fully occupies the second through hole 204.

Figure 2E:
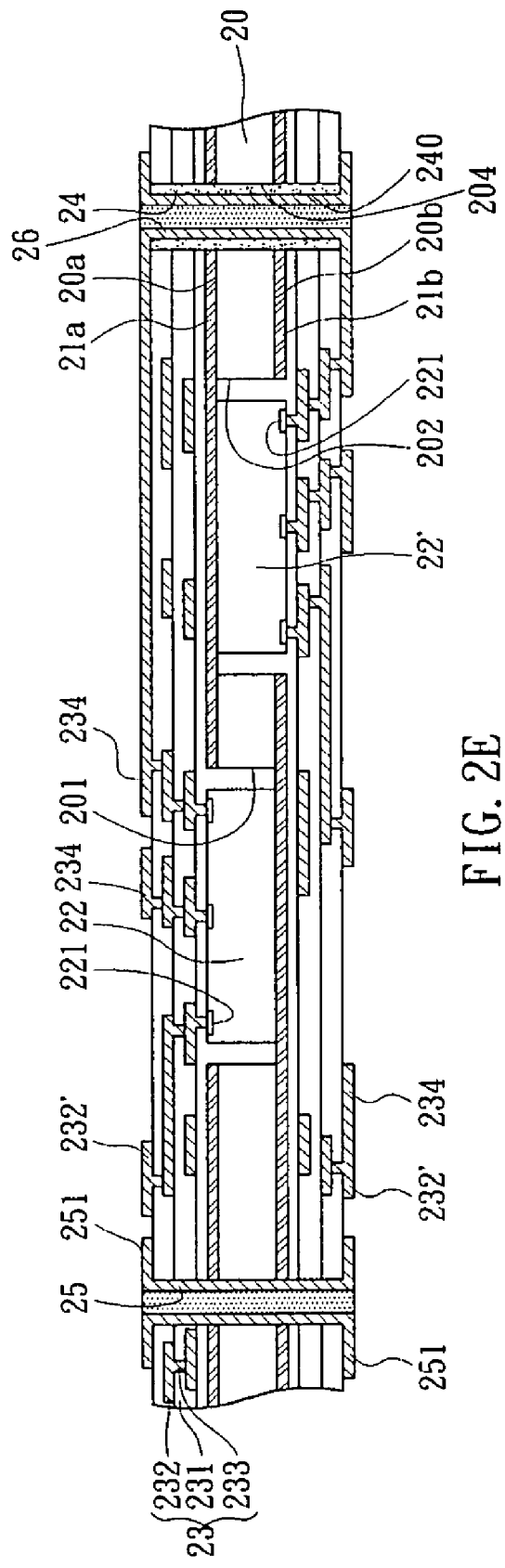
Figure 2E:
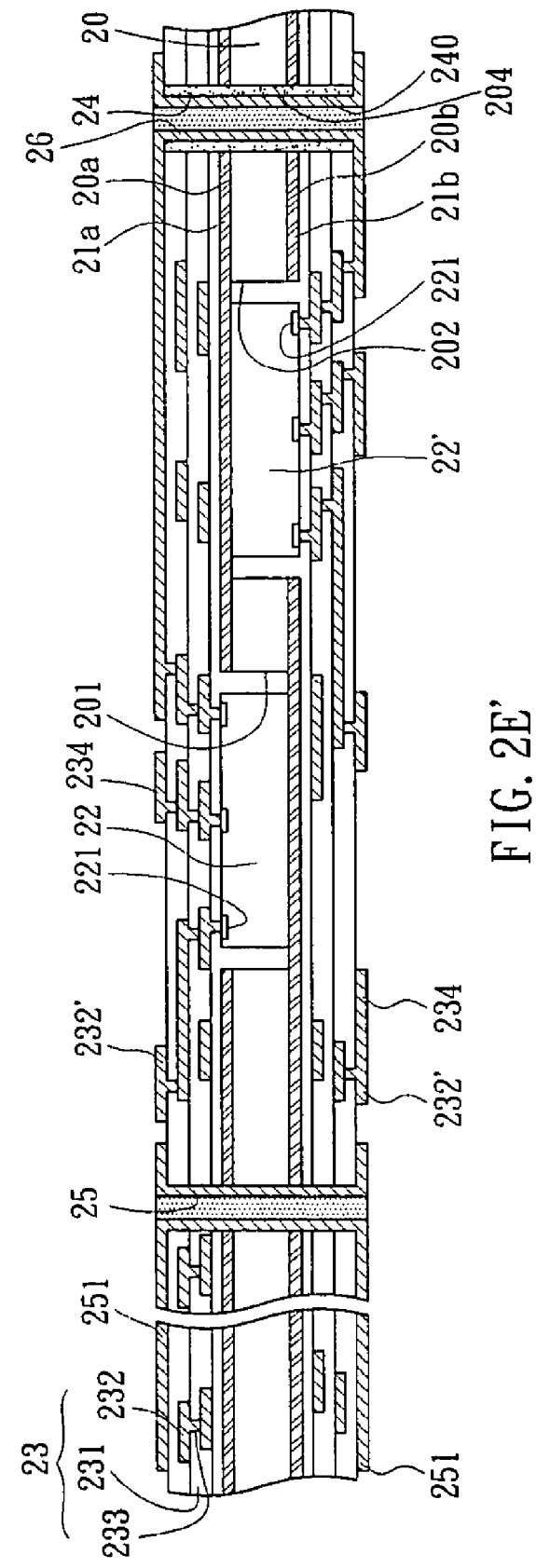

Referring to FIGS. 2E and 2E', a patterning process and an electroplating process are carried out to form a heat-dissipating through hole 25 and a plated through hole 26 within the first through hole 203 and the third through hole 240 respectively, form a wiring layer 232' on the dielectric layer 231 of the build-up circuit structure 23, form a contact pad 251 connecting to the heat-dissipating through hole 25, and form a plurality of conductive pads 234 on the outer surface of the build-up circuit structure 23, as shown in FIG. 2E. FIG. 2E' is a schematic view of an alternative structure for implementing the packaging substrate shown in FIG. 2E. Referring to FIG. 2E', a contact pad 251 connecting to the heat-dissipating through hole 25 is disposed on a surface of the outmost dielectric layer 231 of the build-up circuit structure 23. The heat-dissipating through hole 25 connects the first metal layer and second metal layers 21a, 21b. The plated through hole 26 electrically connects the outmost wiring layers 232' of the build-up circuit structures 23, to thereby electrically connects the semiconductor chip 22 in the first cavity 201 and the semiconductor chip 22' in the second cavity 202. The following description is based on the structure shown in FIG. 2E.

Figure 2F:
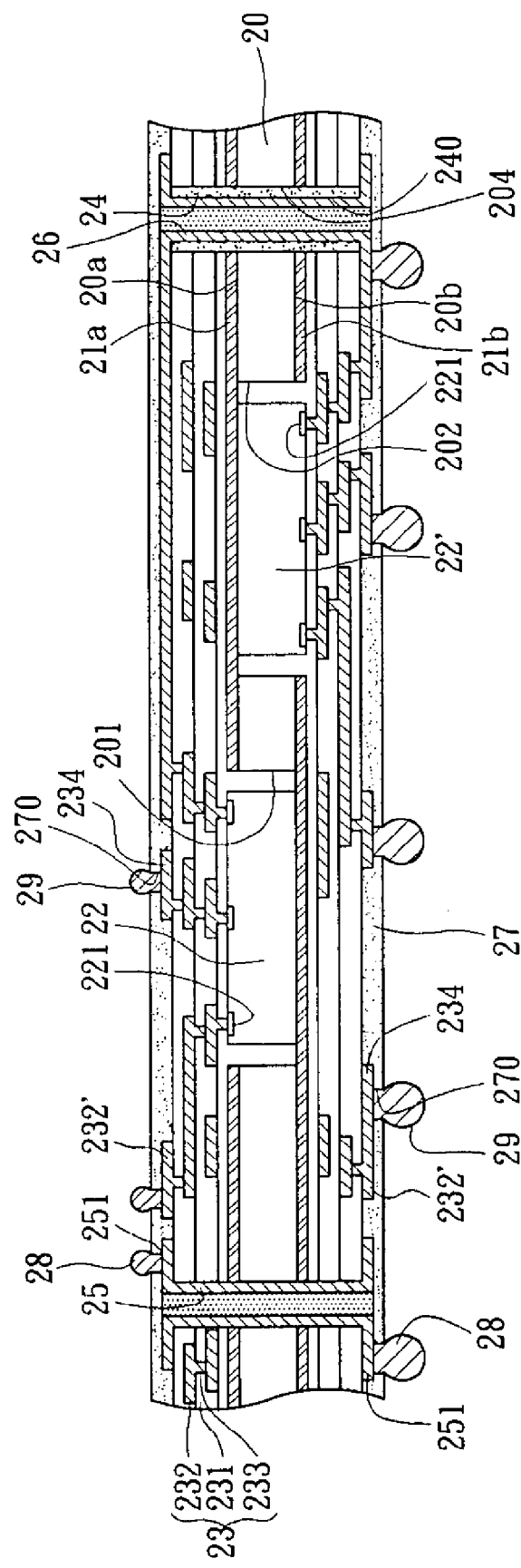

Referring to FIG. 2F, an insulating protective layer 27 is formed on the surface of the build-up circuit structure 23. A plurality of openings 270 are formed in the insulating protective layer 27, thereby exposing the conductive pads 234 and the contact pad 251. A heat-conduction component 28 in the form of a metal ball or a metal pin (not shown) is formed on the contact pad 251 exposed from each of the openings 270. Hence, to enhance heat dissipation, heat generated by the semiconductor chips 22, 22' in operation can be transferred to the heat-conduction component 28 by the first metal layer 21a and the second metal layer 21b and the heat-dissipating through hole 25. An electrical-conduction component 29 in the form of a solder ball is formed on each of the conductive pads 234 exposed from corresponding ones of the openings 270. The electrical-conduction component 29 provides electrical connection with another electronic device. The insulating protective layer 27 is made of solder resist material.

The present invention provides a packaging substrate having a heat-dissipating structure, comprising: a core layer 20 with a first surface 20a having a first metal layer 21a and an opposite second surface 20b having a second metal layer 21b respectively, and with at least a first cavity 201 penetrating the core layer 20 and the first metal layer 21a, so as to expose the second metal layer 21b from the first cavity 201, also at least a second cavity 202 penetrating the core layer 20 and the second metal layer 21b, so as to expose the first metal layer 21a from the second cavity 202; a plurality of semiconductor chips 22, 22' each having an active surface 22a with a plurality of electrode pads 221 thereon and an opposite inactive surface 22b, wherein the semiconductor chips 22, 22' are received in the first cavity 201 and the second cavity 202, and attached to the second metal layer 21b and the first metal layer 21a, respectively, by the inactive surfaces 22b; build-up circuit structures 23 respectively disposed on the first metal layer 21a and the second metal layer 21b as well as the semiconductor chips 22,22' and having a plurality of conductive vias 233 electrically connecting to the electrode pads 221 of the semiconductor chips 22, 22'; and at least a heat-dissipating through hole 25 penetrating the core layer 20 and the build-up circuit structure 23, and connecting the first metal layer 21a and the second metal layer 21b, while a contact pad 251 or an outward extending contact pad 251 connecting to the heat-dissipating through hole 25 is disposed on a surface of the outmost dielectric layer 231 of the build-up circuit structure 23.

The build-up circuit structure 23 comprises at least a dielectric layer 231, a wiring layer 232 disposed on the dielectric layer 231, and the conductive vias 233 disposed in the dielectric layer 231 electrically connecting the semiconductor chips 22,22' and the wiring layers 232. Both the gap between the semiconductor chip 22 and the first cavity 201 and the gap between the semiconductor chip 22' and the second cavity 202 are filled with the dielectric layer 231, thereby fixing the semiconductor chips 22, 22' in the first cavity 201 and the second cavity 202 respectively. An alternative to the above-mentioned involves filling both the gap between the semiconductor chip 22 and the first cavity 201 and the gap between the semiconductor chip 22' and the second cavity 202 with an adhesive 21c, thereby fixing the semiconductor chips 22, 22' in the first cavity 201 and the second cavity 202 respectively. The outmost wiring layers 232' of the build-up circuit structures 23 have a plurality of conductive pads 234, and an electrical-conduction component 29 in the form of a solder ball is disposed on each of the conductive pads 234 to provide electrical connection with another electronic device.

The above structure of the present invention further comprising: at least a plated through hole 26 penetrating the core layer 20 and the build-up circuit structures 23 electrically connecting the outmost wiring layers 232' of the build-up circuit structure 23, wherein an insulation material 24 is disposed surrounding the plated through hole 26 so that the plated through hole 26 is insulated from the core layer 20, the first metal layer 21a, the second metal layer 21b, and the build-up circuit structure 23; and an insulating protective layer 27 disposed on the surface of the build-up circuit structures 23, wherein a plurality of openings 270 are disposed in the insulating protective layer 27, thereby exposing the conductive pads 234 and the contact pad 251. A heat-conduction component 28 in the form of a metal ball or a metal pin (not shown) is disposed on the contact pad 251 exposed from each of the openings 270.

Second Embodiment

Figure 3A:
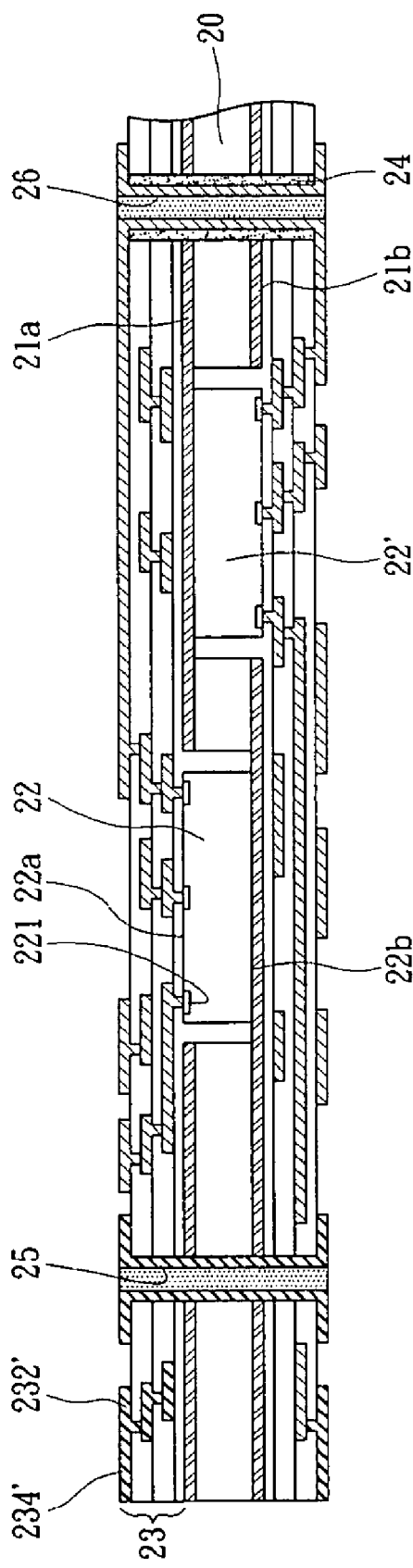
FIGS. 3A to 3C are schematic views showing a second embodiment of a method for fabricating a packaging substrate having a heat-dissipating structure according to the present invention.
Figure 3B:
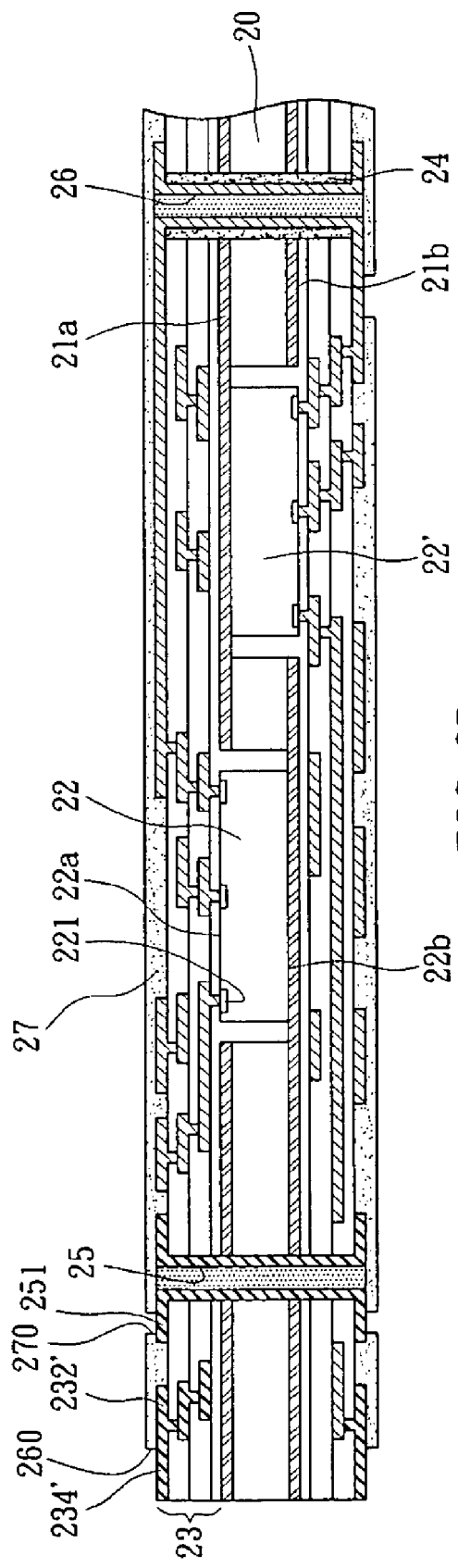
Figure 3C:
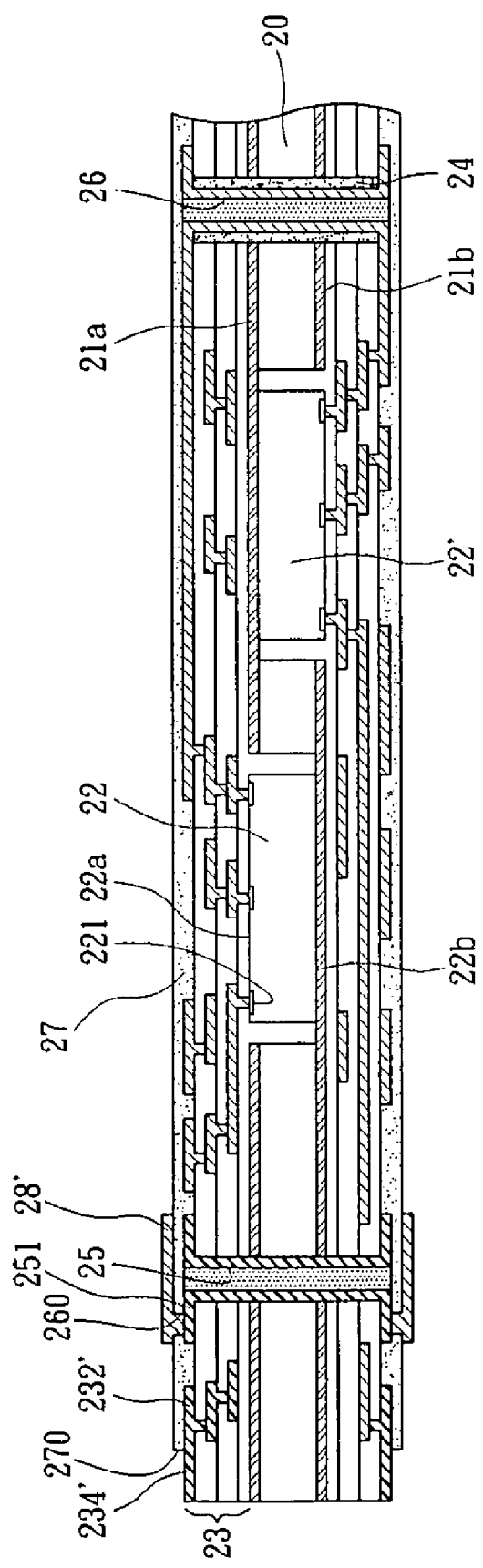

FIGS. 3A to 3C are schematic views showing a second embodiment of a method for fabricating a packaging substrate having a heat-dissipating structure according to the present invention. The second embodiment differs from the first embodiment in that, in the second embodiment, conductive terminals (golden fingers) configured for use with expansion cards and expansion slots function as the conductive pads.

Referring to FIG. 3A, the structure shown in FIG. 2E is provided, wherein the outmost wiring layer 232' of the build-up circuit structure 23 has a plurality of conductive pads functioning as conductive terminals (golden fingers) 234'.

Referring to FIG. 3B, an insulating protective layer 27 is formed on the surface of the build-up circuit structures 23, and a plurality of openings 270 are formed in the insulating protective layer 27, thereby exposing the conductive terminals 234' and the contact pad 251.

Referring to FIG. 3C, a heat-conduction component, such as a heat sink 28', is formed on the contact pad 251 exposed from each of the openings 270. The heat sink 28', which faces outward from the insulating protective layer 27 and communicates with the heat-dissipating through hole 25, enables heat generated by the semiconductor chips 22, 22' in operation to be efficiently dissipated by the first metal layer 21a, the second metal layers 21b, and the heat-dissipating through hole 25, while the conductive terminals (golden fingers) 234' electrically connected to another electronic device.

The build-up circuit structures 23 comprises at least a dielectric layer 231, a wiring layer 232 disposed on the dielectric layer 231, and a plurality of conductive vias 233 disposed in the dielectric layer 231. A plurality of conductive terminals 234' typically configured for use with expansion cards and expansion slots are formed on the build-up circuit structure 23 so as to provide electrical connection with another electronic device. The heat sink 28' is formed on the contact pad 251 and faces outward from the insulating protective layer 27 so as to facilitate heat dissipation.

The present invention provides a packaging substrate having a heat-dissipating structure. The packaging substrate comprises a plurality of semiconductor chips mounted on the first metal layer and the second metal layer exposed from first and second cavities in a core layer. Heat generated by the semiconductor chips in operation is taken by the first metal layer and the second metal layer and then transferred to a heat-conduction component via a heat-dissipating through hole, so as to enhance heat dissipation. The first metal layer, the second metal layer disposed on the core layer, and the heat-dissipating through hole penetrating the core layer together with the build-up circuit structures not only enhance heat dissipation but also eliminate the drawbacks of the prior art, namely a plethora of components, excessive thickness, overweight, and high costs. The packaging substrate of the present invention features enhanced electrical performance and minimal thickness, and is free of warpage by forming a wiring layer on both sides of the packaging substrate.

The foregoing specific embodiments are only illustrative of the features and functions of the present invention but are not intended to restrict the scope of the present invention. It is apparent to those skilled in the art that all equivalent modifications and variations made in the foregoing embodiment according to the spirit and principle in the disclosure of the present invention should fall within the scope of the appended claims.

What is claimed is:

1. A packaging substrate having a heat-dissipating structure, comprising:

a core layer with a first surface having a first metal layer and an opposite second surface having a second metal layer, and with at least a first cavity penetrating the core layer and the first metal layer so as to expose the second metal layer from the first cavity, also at least a second cavity penetrating the core layer and the second metal layer so as to expose the first metal layer from the second cavity;

a plurality of semiconductor chips each having an active surface with a plurality of electrode pads thereon and an opposite inactive surface, wherein the semiconductor chips are received in the first cavity and the second cavity, and attached to the second metal layer and the first metal layer, respectively, by the inactive surfaces;

build-up circuit structures respectively disposed on the first metal layer and the second metal layer as well as the semiconductor chips, and having a plurality of conductive vias electrically connecting to the electrode pads of the semiconductor chips; and at least a heat-dissipating through hole penetrating the core layer and the build-up circuit structures, and connecting the first metal layer and the second metal layer.

2. The packaging substrate having a heat-dissipating structure of claim 1, further comprising an adhesive filling a gap between the first cavity and a corresponding one of the semiconductor chips, to thereby fix the semiconductor chip in the first cavity.

3. The packaging substrate having a heat-dissipating structure of claim 1, further comprising an adhesive filling a gap between the second cavity and a corresponding one of the semiconductor chips, to thereby fix the semiconductor chip in the second cavity.

4. The packaging substrate having a heat-dissipating structure of claim 1, wherein the build-up circuit structures each comprise at least a dielectric layer, a wiring layer disposed on the dielectric layer, and the conductive vias disposed in the dielectric layer electrically connecting the semiconductor chips and the wiring layers, wherein the dielectric layer fills a gap between the first cavity and a corresponding one of the semiconductor chips, to thereby fix the semiconductor chip in the first cavity, also fills a gap between the second cavity and a corresponding one of the semiconductor chips, to thereby fix the semiconductor chip in the second cavity.

5. The packaging substrate having a heat-dissipating structure of claim 1, wherein a contact pad or an outward extending contact pad connecting to the heat-dissipating through hole is disposed on a surface of the outmost dielectric layer of the build-up circuit structure.

6. The packaging substrate having a heat-dissipating structure of claim 5, wherein the outmost wiring layers of the build-up circuit structures have a plurality of conductive pads coplanar with the contact pads.

7. The packaging substrate having a heat-dissipating structure of claim 6, further comprising at least a plated through hole penetrating the core layer and the build-up circuit structures, and electrically connecting the outmost wiring layers of the build-up circuit structures, wherein an insulation material is disposed surrounding the plated through hole so that the plated through hole is insulated from the core layer, the first metal layer, the second metal layer, and the build-up circuit structures.

8. The packaging substrate having a heat-dissipating structure of claim 7, further comprising an insulating protective layer disposed on the surface of the build-up circuit structures, wherein a plurality of openings are disposed in the insulating protective layer, thereby exposing the conductive pads and the contact pad.

9. The packaging substrate having a heat-dissipating structure of claim 8, further comprising a heat-conduction component disposed on the contact pad.

10. The packaging substrate having a heat-dissipating structure of claim 9, wherein the heat-conduction component is one of a metal ball and a metal pin.

11. The packaging substrate having a heat-dissipating structure of claim 8, further comprising an electrical-conduction component disposed on each of the conductive pads.

12. The packaging substrate having a heat-dissipating structure of claim 11, wherein the electrical-conduction component is a solder ball.

13. The packaging substrate having a heat-dissipating structure of claim 6, wherein the conductive pads are conductive terminals.

14. The packaging substrate having a heat-dissipating structure of claim 13, further comprising an insulating protective layer disposed on the surface of the build-up circuit structures, wherein a plurality of openings are disposed in the insulating protective layer, thereby exposing the conductive terminals and the contact pad.

15. The packaging substrate having a heat-dissipating structure of claim 14, further comprising a heat-conduction component disposed on the contact pad.

16. The packaging substrate having a heat-dissipating structure of claim 15, wherein the heat-conduction component is a heat sink.

* * * * *